(12) United States Patent  
Chen et al.

(10) Patent No.: US 6,897,494 B1  
(45) Date of Patent: May 24, 2005

(54) GAN LIGHT EMITTING DIODE WITH CONDUCTIVE OUTER LAYER

(75) Inventors: John Chen, Los Angeles, CA (US); Bingwen Liang, Santa Clara, CA (US); Robert Shih, Los Angeles, CA (US)

(73) Assignee: Dalian Luming Science and Technology Group Co. Ltd., Dalian (CN)

( * ) Notice: Subject to any disclaimer, the term of this patent is extended or adjusted under 35 U.S.C. 154(b) by 0 days.

(21) Appl. No.: 09/626,443

(22) Filed: Jul. 26, 2000

(51) Int. Cl.$^7$ .............................................. H01L 33/00
(52) U.S. Cl. ......................... 257/190; 257/99; 257/103
(58) Field of Search ........................ 257/99, 103, 94, 257/96, 97, 190, 191, 743, 744, 745, 749

(56) References Cited

U.S. PATENT DOCUMENTS

| | | | | |
|---|---|---|---|---|
| 4,145,707 A | * | 3/1979 | Sadamasa et al. | 357/68 |
| 4,214,251 A | * | 7/1980 | Schairer | 357/17 |
| 4,864,370 A | * | 9/1989 | Gaw et al. | 357/17 |
| 5,309,001 A | * | 5/1994 | Watanabe et al. | 257/99 |
| 5,696,389 A | * | 12/1997 | Ishikawa et al. | 257/99 |
| 5,698,865 A | * | 12/1997 | Gerner et al. | 257/94 |
| 5,877,558 A | * | 3/1999 | Nakamura et al. | 257/749 |
| 6,091,197 A | * | 7/2000 | Sun et al. | 313/509 |
| 6,133,589 A | * | 10/2000 | Krames et al. | 257/103 |
| 6,147,364 A | * | 11/2000 | Itaya et al. | 257/76 |
| 6,236,066 B1 | * | 5/2001 | Shiba | 257/99 |
| 6,248,607 B1 | * | 6/2001 | Tsutsui | 438/46 |
| 6,255,129 B1 | * | 7/2001 | Lin | 438/26 |
| 6,268,618 B1 | * | 7/2001 | Miki et al. | 257/99 |
| 6,307,218 B1 | * | 10/2001 | Steigerwald et al. | 257/99 |
| 6,429,032 B1 | * | 8/2002 | Okuyama et al. | 438/22 |
| 6,614,056 B1 | * | 9/2003 | Tarsa et al. | 257/91 |

FOREIGN PATENT DOCUMENTS

| | | | |
|---|---|---|---|
| JP | 4-78174 | * 3/1992 | 257/99 |
| JP | 10-308534 | 11/1998 | |

OTHER PUBLICATIONS

Et al. "Thermal Stability of Ohmic Contacts to n–InxGa1–xN," Mat. Res. Symp. Proc. vol. 395, 1996; pp. 825–830.*

* cited by examiner

*Primary Examiner*—Bradley Baumeister  
(74) *Attorney, Agent, or Firm*—Jean C. Edward; Dickinson Wright PLLC

(57) ABSTRACT

A GaN based LED comprises: a three layer buffer which is a template for growth of a high quality I GaN platform for quality growth of subsequent layers; a light emitting structure; and complementary N and P electrode structures which spread current flowing between the electrodes fully across the light emitting structure.

9 Claims, 1 Drawing Sheet

GAN LIGHT EMITTING DIODE WITH CONDUCTIVE OUTER LAYER

The present invention relates to GaN compound Light Emitting Diodes.

BACKGROUND OF THE INVENTION

A semiconductor light-emitting diode (LED) comprises: a substrate; a light emitting structure; and a pair of electrodes for powering the diode. Light Emitting Diodes which are based on Gallium Nitride compounds generally comprise: a transparent, insulating substrate, e.g. a sapphire substrate. With an insulating substrate, both electrodes must be connected from the front of the LED to layers of the light emitting structure.

It is common practice to utilize a Ni/Au contact layer between the window layers formed on the light emitting structure and a thick Au bond pad. This arrangement exhibits limited adhesion; and the contact layer tends to peel during wire bonding to the Au bond pad.

The magnitude of the light emitted by an LED depends on: (a) The percent of the light emitting region that is activated by current flowing between the electrodes; (b) The efficiency of the window structure; and (c) The internal losses of generated light.

SUMMARY

In accordance with one aspect of the present invention, there is provided a window structure which comprises: a semi-transparent, conductive outer layer and a complementary pair of P and N electrodes. The conductive outer layer and the electrodes together efficiently spread current across the face of the light emitting diode and maximize the light emitting area of the window. The P electrode is formed in the shape of a stylized letter T. The head of the T is a bar formed on the top face of the window along one side of the window face. The leg of the T comprises a bond pad attached at the middle of the head. The N electrode comprises a bond pad assembly which attaches to the N cladding layer through an aperture located at the middle of the side of the face opposite to the head of the T.

The P electrode is formed of a layer of Ti which passes through the contact layer and provides excellent adhesion to window layers formed on the light emitting structure. An Au bond pad is formed on, and in the form of the Ti electrode. Thus, peeling is avoided.

DETAILED DESCRIPTION OF THE PREFERRED EMBODIMENTS

Figure 1A:
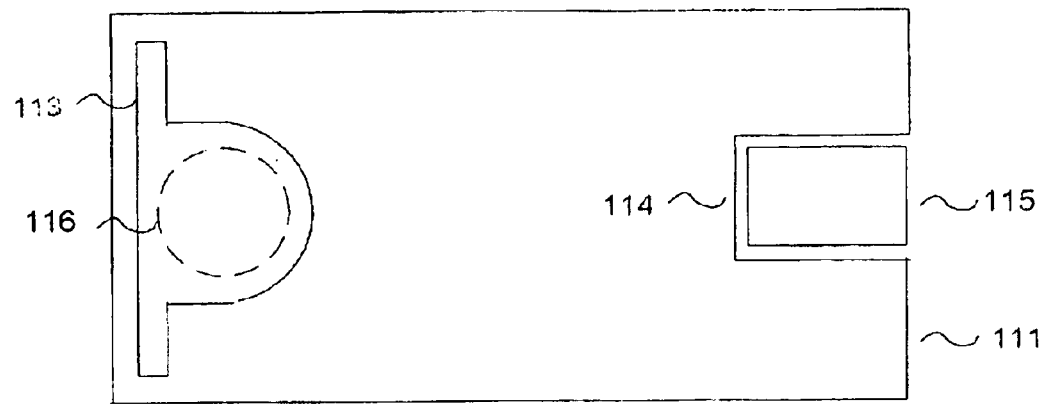
FIGS. 1a and 1b are schematic drawings of the top and side views of an illustrative embodiment of the improved LED.
Figure 1B:
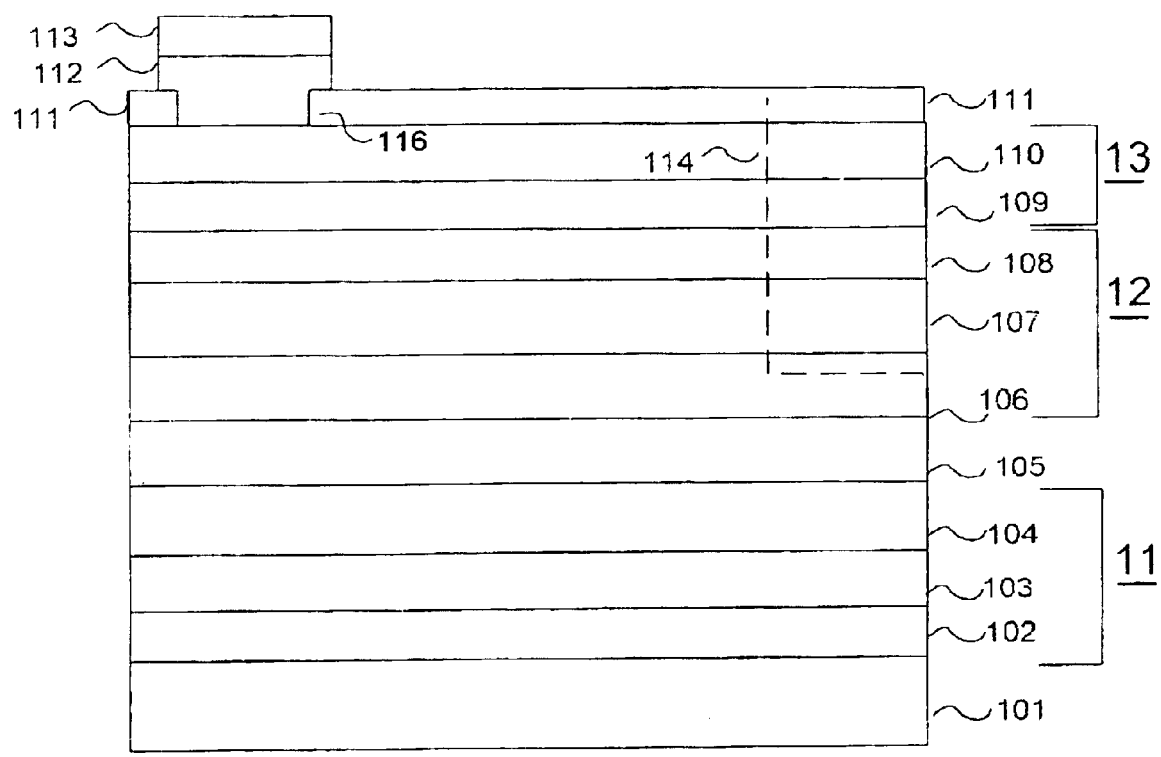

The illustrative LED of FIGS. 1a and 1b is a GaN based device. The structure of FIGS. 1a and 1b comprises: sapphire substrate 101; buffer structure 11; GaN substitute substrate layer 105; light emitting structure 12; window layers 13; semi transparent conductive layer 111; bond pad adhesion layer 112; P electrode bond pad 113; and N electrode bond pad 115 which is not shown in FIG. 1b.

Layers 102 through 110 are grown in a Metal Organic Chemical Vapor Deposition MOCVD reactor. The details of MOCVD growth of the stated layers are well known in the industry and will not be discussed herein except to specify certain details of the growth process which are particularly relevant to the present invention.

The remaining components of our improved LED, namely, semi transparent layer 111, adhesion pad 112, P bond pad 113, and N bond pad 115 are formed by evaporation in apparatus other than a MOCVD reactor.

Buffer (11) Between Sapphire Substrate and GaN

In the illustrative embodiment of the improved GaN based LED, the 0001 face of sapphire substrate 101 is exposed for growth of the first buffer layer 102. The second buffer layer 103 is formed of AlGaN to migrate to the lattice constant of GaN. The final buffer layer 104 is formed of GaN to provide a template for the growth of the high quality I GaN layer 105 which serves as a platform for growth of the light emitting structure 12.

Light Emitting Structure (12)

The light emitting structure comprises N cladding layer 106, active region 107, and P cladding layer 107. Layer 106 is formed of silicon doped GaN.

In the illustrative example of FIG. 1b, active region 107 is a Silicon doped N type GaInN/GaN Multi Quantum Well (MQW) structure.

P cladding layer 108 is formed of Mg doped AlGaN.

Window Layers

The first window layer 109 is formed of Mg doped GaN. Layer 109 has a nominal thickness of 300 nm. The second window layer 110 is similarly formed of Mg doped GaN. However, layer 110 is more highly doped to permit an ohmic contact between that layer and $NiO_x$/Au contact layer 111.

Completion of the MOCVD Growth Process

Growth of GaN layers is achieved with introduction of gaseous flows of Gallium with $H_2$ as a carrier gas, $NH_3$ as a group V material, and Mg as a dopant. In the absence of an appropriate cool down protocol, Hydrogen passivation of the Mg may occur. In which case, the conductivity of a Mg doped layer is reduced.

In order to avoid Hydrogen passivation of the Mg doped layers 108, 109 and 110, the following described cool down protocol has been adopted upon completion of the MOCVD growth.

1. The ambient gas of the reactor is switched from $H_2$ to $N_2$ immediately after completion of the LED structure;
2. The reactor temperature is ramped down from the growth temperature to about 900 degrees C. in about 2 minutes;
3. The flow of $NH_3$ is terminated;
4. The reactor temperature is further ramped down to about 750 degrees C. in about 2 minutes;
5. Temperature of about 750 degrees C. is held for about 20 minutes;
6. The heater of the reactor is shut off and the reactor is allowed to complete cool down naturally. Experience shows that cool down to 120 C occur in about 30 minutes after heater shut off.

The resulting product exhibits the expected desired physical and electrical characteristics.

Formation of the Electrode Structures

The top view of FIG. 1a and the side view of FIG. 1b together illustrate the locations and forms of both the P electrode 113 and of the N electrode 115.

Layer 111 is a thin, semi-transparent, conductive layer of $NiO_x$/Au which is deposited over the entire exposed face of layer 110. A first opening, identified as 114 in both figures, is etched through layers 111 to 107 to reach N cladding layer 106.

As seen in FIG. 1a, a second opening 116 is formed in layer 111 to permit deposit of a Titanium adhesion structure 112 to contact window layer 110. In addition to reaching through to layer 110, titanium structure 112 is deposited on $NiO_x$/Au layer 111 in the shape of the Au bond pad as illustrated in FIG. 1a. As seen in FIG. 1a, the top view of the Au bond pad forms a stylized "T". The bar of the T is deposited as shown along left side of the figure, and the leg of the T is the semi-circular portion which joins that bar. The Au bond pad 113 is deposited on top of titanium structure 112.

Gold Bond pad 115 is deposited on N cladding layer 106 to form an ohmic contact therewith.

The combination of the T bar of the P electrode bond pad 113 along one side of the outer surface, the conductive $NiO_x$/Au layer 111, and the placement of the N electrode centrally along the opposite side of the outer face spreads current flowing between the electrodes evenly to more fully activate the light emitting region of MQW structure 107.

Since the Mg doped layer do not suffer from Hydrogen passivation, it is not necessary to heat treat the structure to activate the Mg doping in those layers. However, the $NiO_x$/Au layer 111 and the Ti and Au contact structure are heated in an atmosphere of molecular nitrogen and air. Thus, the Ni is coverted to a form of nickel oxide. This heat treatment improves the quality of the contact structures.

The invention has been described with particular attention to its preferred embodiment; however, it should be understood that variations and modifications within the spirit and scope of the invention may occur to those skilled in the art to which the invention pertains.

What is claimed is:

1. A GaN based Light Emitting Diode (LED) comprising:
   a substrate;
   a light emitting structure formed on said substrate including an active region;
   a multi-layer window structure formed of a first layer and a second layer of Mg doped GaN, said window structure being disposed on the light emitting structure;
   a transparent conductive outer layer formed on the window structure, the conductive outer layer having an exposed surface and at least one opening formed therein;
   a first opening in said transparent conductive outer layer, exposing an upper surface of a portion of the Mg doped GaN multi-layer window structure;
   a second opening formed through to the N cladding layer of the light emitting structure at one side of said light emitting structure; and
   a complementary pair of electrodes defined by:
      (a) an N electrode formed at said second opening at said one side of said light emitting structure, in ohmic contact with the light emitting structure, and
      (b) a P electrode formed at said first opening, in a shape of a bar, with one side of said bar having a semi-circular protrusion, the P electrode including a bond pad adhesion layer with a bond pad layer deposited thereon, wherein only the semi-circular protusion of the P electrode extends through said first opening to contact the upper surface of the multi-layer window structure, while the bar is disposed on top of the transparent conductive outer layer.

2. The GaN based LED of claim 1, wherein said substrate is a sapphire substrate.

3. The GaN based LED of claim 1, wherein said active region is a silicon doped GaInN/GaN multi-quantum-well (MQW) structure.

4. The GaN based LED of claim 1, further comprising:
   a multi layer buffer structure disposed on said substrate, said multi layer buffer structure including a first buffer layer, a second buffer layer formed of AlGaN and disposed on said first buffer layer, and a third buffer layer formed of GaN disposed on said second buffer layer.

5. The GaN based LED of claim 1, wherein the light emitting structure compises:
   (a) an N cladding layer formed of silicon doped GaN;
   (b) an active region multi quantum well (MQW) structure formed on the N cladding layer; and
   (c) a P cladding layer formed on the active region.

6. The GaN based LED of claim 1, wherein said second layer of said multi-layer window structure is more highly doped than said first layer.

7. The GaN based LED of claim 1, wherein the transparent conductive outer layer is formed of $NiO_x$/Au.

8. The GaN based LED of claim 1, wherein the bond pad adhesion layer is formed of Ti, and the bond pad layer is formed of Au.

9. A GaN based Light Emitting Diode (LED) comprising:
   a substrate:
   a multi-layer buffer structure disposed on said substrate;
   a light emitting structure formed on said multi-layer buffer structure, including:
      (a) an N cladding layer;
      (b) an active region formed on the N cladding layer, and
      (c) a cladding layer formed on the active region;
   a multi-layer window structure formed of Mg doped GaN, disposed on the light emitting structure;
   a conductive outer layer formed on the window structure;
   a first opening in said conductive outer layer exposing an upper surface of said uppermost layer of a portion of the Mg doped GaN multi-layer window structure; and
   a second opening formed in said conductive layer through to the N cladding layer of the light emitting structure at one side of said light emitting structure; and
   a complementary pair of electrodes defined by:
      (a) an N electrode including a bond pad formed at said second opening at said one side of the light emitting structure, in ohmic contact with the cladding layer of the light emitting structure, and
      (b) a P electrode formed at said first opening, in a shape of a bar, with one side of said bar having a semi-circular protrusion, the P electrode including a bond pad adhesion layer with a bond pad layer deposited thereon, wherein only the semi-circular protusion of the P electrode extends through said first opening to contact the upper surface of the portion of the Mg doped GaN window structure, while the bar is disposed on top of the transparent conductive outer layer.

* * * * *